United States Patent [19]

Jerome et al.

[11] Patent Number: 5,670,394

[45] Date of Patent: Sep. 23, 1997

[54] METHOD OF MAKING BIPOLAR TRANSISTOR HAVING AMORPHOUS SILICON CONTACT AS EMITTER DIFFUSION SOURCE

[75] Inventors: Rick C. Jerome, Monument; Ian R. C. Post, Colorado Springs, both of Colo.

[73] Assignee: United Technologies Corporation, Windsor Locks, Conn.

[21] Appl. No.: 317,155

[22] Filed: Oct. 3, 1994

[51] Int. Cl.⁶ .................................................. H01L 21/265
[52] U.S. Cl. .......................... 437/31; 437/141; 437/160; 437/174; 148/DIG. 10; 148/DIG. 11; 257/511; 257/525; 257/569
[58] Field of Search ............... 437/31, 141, 160, 437/174; 148/DIG. 10; 257/511, 512, 525, 555, 569, 574

[56] References Cited

U.S. PATENT DOCUMENTS

| | | | |
|---|---|---|---|
| 3,730,780 | 5/1973 | Ghosh | 257/555 |
| 4,301,588 | 11/1981 | Horng et al. | 29/276 |
| 4,977,098 | 12/1990 | Yu et al. | 437/31 |
| 5,013,677 | 5/1991 | Hozumi | 437/31 |
| 5,137,839 | 8/1992 | Nirtsu | 148/DIG. 10 |
| 5,204,274 | 4/1993 | Kanda et al. | 437/31 |
| 5,391,518 | 2/1995 | Bhushan | 437/190 |
| 5,439,833 | 8/1995 | Herbert et al. | 437/31 |

FOREIGN PATENT DOCUMENTS

| | | |
|---|---|---|
| 3228335 | 9/1991 | Japan . |
| 2243486 | 10/1991 | United Kingdom ..... 437/31 |
| WO9306622 | 4/1993 | WIPO . |
| 3006622 | 4/1993 | WIPO ..... 257/555 |

OTHER PUBLICATIONS

Onai et al., "Self-Aligned ... LSI's", IEEE Transactions on Electron Devices, vol. 42, No. 3, pp. 413–417, Mar. 1995.

IEEE Transactions on Electron Devices, "Investigation of Boron Diffusion In Polysilicon and Its Application to the Design of p–n–p Polysilicon Emitter Bipolar Transistors with Shallow Emitter Juncitons", I. Post, et al Nov., 1991 No. 11, New York, US, pp. 2442–2451.

IEEE Transactions on Electron Devices, "The Benefits of Fluorine In pnp Polysilicon Emitter Bipolar Transistors", Nicholas E. Moiseiwitsch et al. (1994) Jul., No. 7, New York, NY, US, pp. 1249–1255.

IEEE Transactions on Electron Devices, "Characteristics of Polysilicon Contacted Shallow Junction Diode Formed with a Stacked–Amorphous–Silicon Film", Shye–Lin Wu et al, (1993) Oct., No. 10, New York, US, pp. 1797–1804.

Primary Examiner—John Niebling
Assistant Examiner—Long Pham

[57] ABSTRACT

The present invention teaches a method for fabricating a bipolar junction transistor ("BJT") from a semiconductor substrate having a base region, wherein the BJT comprises an increased Early voltage. The method initially comprises the step of forming a patterned interlevel dielectric layer superjacent the substrate such that a segment of the substrate is exposed. Subsequently, a contact comprising a material having a grain size smaller than polycrystalline silicon is formed superjacent the patterned interlevel dielectric layer and the segment of the substrate exposed. The contact is then implanted with a dopant. Once implanted, the substrate is annealed to enable the dopant to diffuse from the contact into the base region impeded by the grain size to form an emitter region and thereby increase the Early voltage of the bipolar junction transistor.

12 Claims, 2 Drawing Sheets

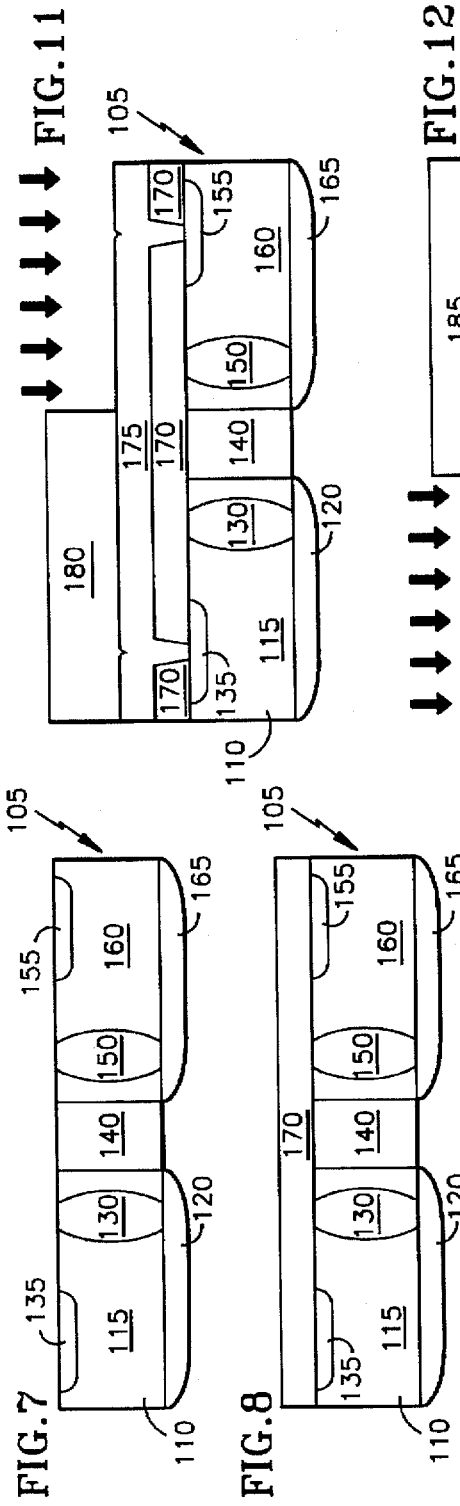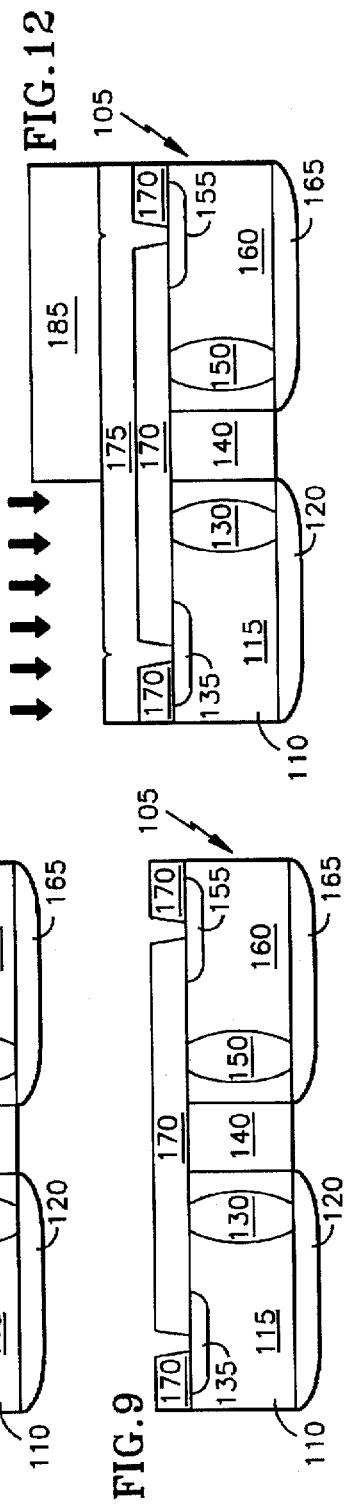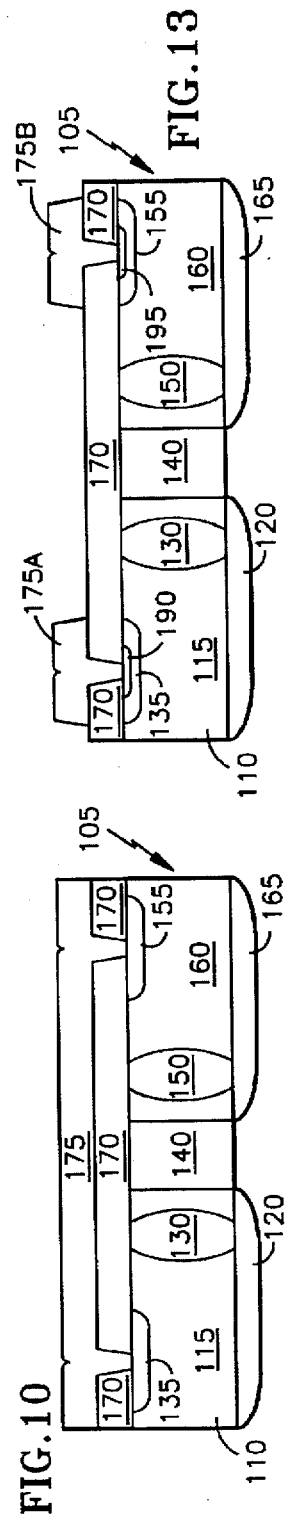

ized in terms of the degree of modulation of the width
5,670,394

METHOD OF MAKING BIPOLAR TRANSISTOR HAVING AMORPHOUS SILICON CONTACT AS EMITTER DIFFUSION SOURCE

TECHNICAL FIELD

This invention relates to the field of semiconductors, and more particularly, to a method of fabricating a bipolar junction transistor.

BACKGROUND ART

In the semiconductor industry, bipolar junction transistors ("BJT") are known and used for both amplifying and switching devices. When employed in the former device, the BJT typically amplifies a small alternating current ("AC") signal according to its particular current gain characteristics.

BJT type devices essentially comprise three doped active areas—an emitter, a base and a collector region. These regions form a first diode between the base and emitter, and a second diode between the base and collector. Each diode junction is either forward or reverse biased depending on the external voltage applied thereto. The BJT is termed "forward active" when both the emitter base junction diode is forward biased and the collector base junction diode is reversed biased.

One phenomenon of significance with respect to bipolar junction transistor operation and design is its "Early voltage" ($V_A$). The Early voltage effect deals with the natural propensity of a BJT's base width, particularly in vertical configurations, to decrease as the voltage applied across the collector base junction is increased. This effect has been attributed to the increase in the collector base depletion region's width. The Early voltage of a particular BJT is quantified in terms of the degree of modulation of the width of the base.

As industry moves to higher density transistor applications, the junction depths of these devices will be reduced accordingly. This reduction in junction depth inherently affects the Early voltage of the device. Further, Early voltages are not easily controllable during BJT fabrication, particularly as the manufacturing processes becomes more intricate. Early voltage variations result in unpredictable voltage gain and also impact the output offset when employing BJTs as a switching device.

Large Early voltage have several other beneficial affects. Firstly, the BJT's maximum voltage gain is mathematically proportional to its Early voltage, as demonstrated by following formula:

$$a_0 \cong (V_A) * ([(k*T)/(q)]^{-1})$$

where $a_0$ is the maximum voltage gain, $V_A$ is the Early voltage, and $(k*T)/(q)$ represents the thermal voltage. Further, the larger the Early voltage, the larger the output resistance of the device. This is supported by the following mathematical equation:

$$\Delta V_{CE}/\Delta I_C = V_A/I_C = r_0$$

where $\Delta V_{CE}$ is the rate of change in the collector emitter junction voltage, $\Delta I_C$ is the rate of change in the collector current, $V_A$ is the Early voltage, $I_C$ is the collector current, and $r_0$ is the output resistance of the BJT.

In view of the above, a need exists for increasing the Early voltage without substantially impacting other characteristics such as current gain. The semiconductor industry, however, has yet to formulate such a method.

DISCLOSURE OF THE INVENTION

The primary advantage of the present invention is to overcome the limitations of the prior art.

A further advantage of the present invention is to provide a method for improving the Early voltage performance of BJTs.

In order to achieve the advantages of the present invention, a method is disclosed for fabricating a bipolar junction transistor ("BJT") from a semiconductor substrate having a base region, wherein the BJT comprises an increased Early voltage. The method initially comprises the step of forming a patterned interlevel dielectric layer superjacent the substrate such that a segment of the substrate is exposed. Subsequently, a contact comprising a material having a grain size smaller than polycrystalline silicon is formed superjacent the patterned interlevel dielectric layer and the segment of the substrate exposed. The contact is then implanted with a dopant. Once implanted, the substrate is annealed to enable the dopant to diffuse from the contact into the base region. The diffusion of the dopant is impeded by the contact layer's small grain size, relative to polysilicon, to form an emitter region and thereby increase the Early voltage of the bipolar junction transistor.

BRIEF DESCRIPTION OF THE DRAWINGS

The present invention will be better understood from reading the following description of non-limited embodiments, with reference to the attached drawings, wherein below:

FIG. 7 illustrates a semiconductor structure prior to undergoing a first step of a second embodiment of the present invention;

FIG. 8 illustrates the semiconductor structure formed according to the first step of the second embodiment of the present invention;

FIG. 9 illustrates the semiconductor structure formed according to the second step of the second embodiment of the present invention;

FIG. 10 illustrates the semiconductor structure formed according to the third step of the second embodiment of the present invention;

FIG. 11 illustrates the semiconductor structure formed according to the fourth step of the second embodiment of the present invention;

FIG. 12 illustrates the semiconductor structure formed according to the fifth step of the second embodiment of the present invention; and FIG. 13 illustrates the semiconductor structure formed according to the sixth step of the second embodiment of the present invention.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
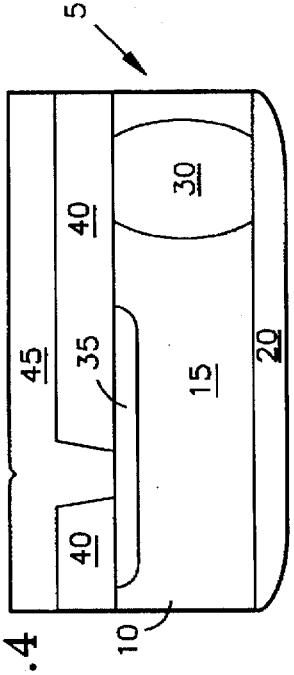
FIG. 1 illustrates a semiconductor structure prior to undergoing a first step of a first embodiment of the present invention.

Referring to FIG. 1, a semiconductor structure 5 is shown prior to undergoing a first step of a first embodiment of the present invention. As shown, the structure comprises a semiconductor substrate 10 having various dopant regions necessary for fabricating a bipolar junction transistor ("BJT"), preferably having a vertical configuration. The particular dopants employed for these regions are dependent on the conductivity type—PNP or NPN—of the transistor. While the present invention has shown some advantages with regards to NPN transistors, the benefits are more clearly associated with regards to PNP transistors. Thus, as the present invention is preferred for PNP transistors, for the purposes of illustration, the BJT described hereinbelow will have, though not limited to, a PNP type conductivity configuration.

Given this PNP conductivity, substrate 10 comprises a P$^-$ well 15 having a diffusion depth substantially in the range of 2 μm to 3 μm and a P$^+$ buried layer 20. Substrate 10 further comprises a P$^+$ sink deep diffusion region 30 having a diffusion depth of approximately 3 μm.

Formed within P$^-$ well 15 is an N$^-$ base 35. N$^-$ base 35 has a junction depth of approximately 0.3 μm. Further, N$^-$ base 35 comprises a silicon bandgap of approximately 1.1 eV. N$^-$ base 35 is formed by first implanting a base type dopant and subsequently performing an annealing step.

Figure 2:
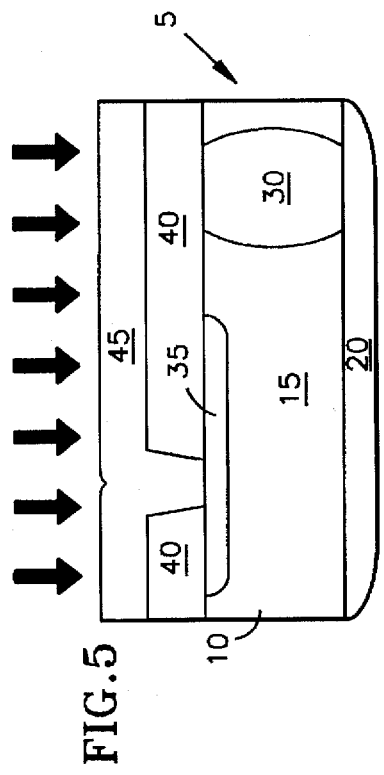
FIG. 2 illustrates the semiconductor structure formed according to the first step of the first embodiment of the present invention.

Referring to FIG. 2, semiconductor structure 5 is shown after undergoing the first step of the first embodiment. Here, an interlevel dielectric layer 40 is formed superjacent the upper surface of the substrate 10. Interlevel dielectric layer 40 preferably comprises silicon dioxide, though other dielectric materials may be employed, and has a thickness of approximately 1000Å. Further, layer 40 may be formed by various means known in the art, including a thermal growth or deposition step, as well as through rapid thermal processing techniques.

Figure 3:
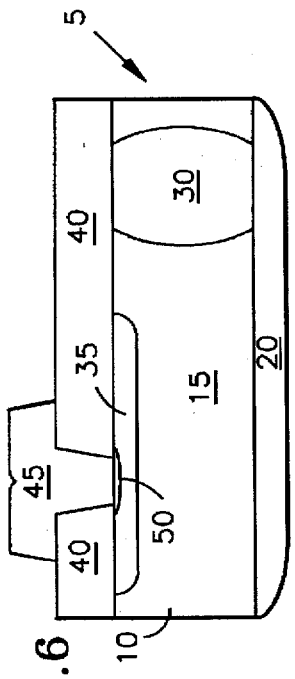
FIG. 3 illustrates the semiconductor structure formed according to the second step of the first embodiment of the present invention.

Referring to FIG. 3, semiconductor structure 5 is shown after undergoing the second step of the first embodiment. Upon forming interlevel dielectric layer 40, the layer is patterned by removing selected portions such that a segment of substrate 10, and more particularly, N$^-$ base 35 is exposed. This gap is created to provide electrical access to a subsequently formed emitter region, described hereinbelow.

The step of patterning interlevel dielectric layer 40 may be realized by several known methods. One such method includes depositing a layer of photoresist (not shown) superjacent interlevel dielectric layer 40 according to a predetermined pattern. This pattern leaves the segment of layer 40 to be removed uncovered by the photoresist. With the pattern of photoresist developed, those surface areas not covered by the photoresist are then etched. Thus, the areas covered by the photoresist remain intact, and the remaining photoresist layer is removed, thereby resulting in the structure of FIG. 3.

Subsequent to the step of patterning, layer 40 in conjunction with the segment of substrate 10 exposed are atomically cleaned by means of an interfacial etch to remove native oxide (not shown). In an open loop system, upon completing this additional step, a native oxide layer having a known thickness approximately in the range of 4Å to 8Å will regrow superjacent both layer 40 and the segment of substrate 10 exposed. However, in a further embodiment, a closed loop system is employed, virtually eliminating the regrowth of native oxide.

Figure 4:
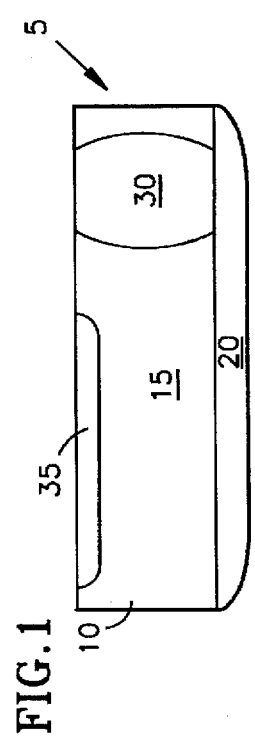
FIG. 4 illustrates the semiconductor structure formed according to the third step of the first embodiment of the present invention.

Referring to FIG. 4, semiconductor structure 5 is shown after undergoing the third step of the first embodiment. Once interlevel dielectric layer 40 is patterned and cleaned, a contact layer 45 is formed superjacent interlevel dielectric layer 40. Contact layer 45 preferably comprises amorphous silicon because its smaller grain size relative to polysilicon slows the subsequent diffusion of dopants into the N$^-$ base 35 to form an emitter. However, alternatives to amorphous silicon may be also employed to achieve a similar purpose.

The slower diffusion rate realized by the present invention can better understood by comparing the diffusion enhancement factors of known polysilicon contact with the present invention. Diffusion enhancement factor is defined as the ratio of diffusion in the contact layer to substrate. In the known polysilicon design, this ration is approximately 200. However, employing the present invention, using a contact layer have a small grain size relative to polysilicon, this ratio is in the range of approximately 300 to 400.

Contact layer 45 may be formed by any one of several techniques known to one of ordinary skill in the art, such as plasma enhanced chemical vapor deposition ("PECVD"). However, a low pressure chemical vapor deposition ("LPCVD") step is preferred. When using an LPCVD, the step would be preferably performed at a temperature substantially in the range of 450° C. and 600° C. and at a pressure substantially in the range of 100 mT and 200 mT.

Figure 5:
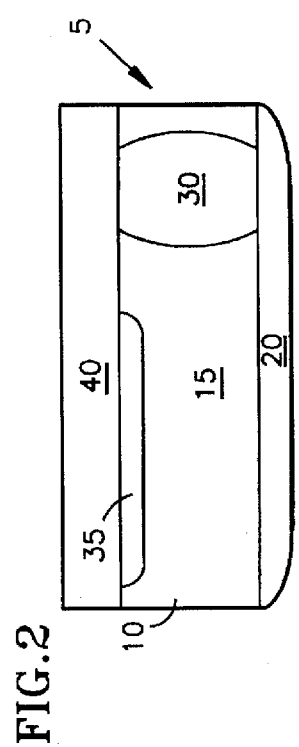
FIG. 5 illustrates the semiconductor structure formed according to the fourth step of the first embodiment of the present invention.

Referring to FIG. 5, semiconductor structure 5 is shown after undergoing the third step of the first embodiment. Here, contact layer 45 is implanted with a dose of a dopant. As a result of this step, an emitter region 50 of the BJT may be ultimately formed within N$^-$ base 35.

The step of implanting is preferably performed at a electron voltage of substantially in the range of 20 KeV and 60 KeV. Further, the preferable dose of the dopant implanted into contact layer 45 is substantially in the range of $2 \times 10^{15}$ to $2 \times 10^{16}$ cm$^{-2}$. The dopant selected for implanting into contact layer 45 is dependent on the conductivity type of BJT to be fabricated. Where the BJT is a PNP type transistor, the dopant preferably comprises boron, while phosphorus is preferred for an NPN device, though arsenic may also be employed.

Figure 6:
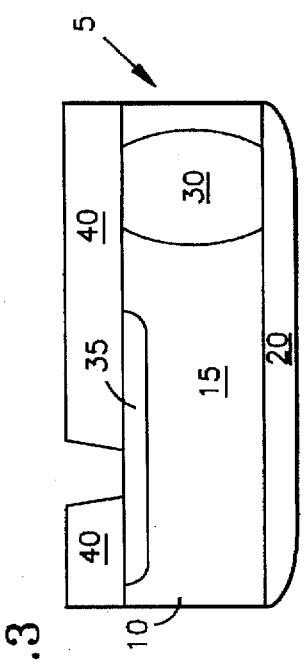
FIG. 6 illustrates the semiconductor structure formed according to the fifth step of the first embodiment of the present invention.

Referring to FIG. 6, semiconductor structure 5 is illustrated upon undergoing the fifth step of the first embodiment of the present invention. As contact layer 45 has now been implanted with a dopant necessary for the construction of the emitter 50, an electrical contact may be formed by removing portions of contact layer 45.

The step of removing portions of the contact layer 45 to form an electrical contact may be realized by various methods. One such method includes depositing a layer of photoresist (not shown) superjacent contact layer 45 according to a predetermined pattern. This pattern exposes a first and second region of layer 40 to be removed. With the pattern of photoresist developed, the first and second region not covered by the photoresist are then etched resulting in the electrical contact of FIG. 6.

With the electrical contact formed, a final anneal step is required to diffuse the implanted dopants within the contact into the N⁻ base 35. As a result of enabling the implanted dopants to diffuse into the N⁻ base 35, emitter 50 is formed, thereby completing the fabrication of the BJT.

This step of annealing may be realized by various methods known in the art. In one embodiment, the semiconductor structure is heated in a furnace at a temperature substantially in the range of 850° C. to 1000° C. for a time substantially in the range of 5 minutes to 2 hours. In a further embodiment, the semiconductor structure is heated in a rapid thermal processing chamber at a temperature substantially in the range of 1000° C. to 1200° C. for a time substantially in the range of 10 seconds to 1 minute.

While the steps described herein detail the formation of an emitter contact, collector and base contacts are also required to fabricate an operational bipolar junction transistor. These additional steps may be realized by various methods, including patterning the interlevel dielectric layer 40, as well as the contact layer 45, accordingly.

It should be noted that in an alternate embodiment of the present invention, an emitter contact is initially formed superjacent the segment of the substrate and coupled with the N⁻ base of the BJT. The emitter contact comprises a material having grain size smaller than polycrystalline silicon such as amorphous silicon. Subsequently, the contact is implanted with a dopant and then annealed to cause the dopants to diffuse into the base region and form the emitter region. As before, the diffusion of dopants during the implant step are impeded by the grain size of the emitter contact, thereby producing a shallower emitter junction depth and resulting in an increased Early voltage. This embodiment, unlike the first, utilizes no recited interlevel dielectric layer. Further, here, the step of forming the emitter contact comprises several additional steps detailed herein.

It has been observed that the smaller grain size of contact 45 relative to substrate 10, slows the diffusion of dopants—boron—during the anneal step into N⁻ base 35 in forming emitter 50. As a result of this slower diffusion rate, emitter 50 comprises a shallower emitter junction within N⁻ base 35.

By devising this method, the resultant PNP type BJT was observed to have a substantially improved Early voltage over known polysilicon emitter designs, while maintaining or improving the device's current gain by reducing the base current. This rise in the Early voltage can be attributed to a reduction in the pinched base sheet resistance.

In one experiment, an Early voltage of approximately 80V, a current gain ($\beta$) of 53, and a current gain Early voltage product of 4240, were measured on the resultant BJT of the present invention. In contrast, an Early voltage of 48V, a current gain ($\beta$) of 53, and a current gain Early voltage product of 2544 were measured on a polysilicon emitter type BJT not employing the present invention. Thus, a conclusion can be arrived at that the present invention increases the Early voltage, while maintaining the device's current gain ($\beta$).

It should, however, be noted that the increase in value of the Early voltage may be somewhat dependent on the biasing voltage employed. In the above referred to experiment, the BJTs employed for comparative purposes utilized a 35V biasing voltage. The value of the Early voltage would be accordingly reduced for smaller biasing voltages, though the increase would be proportionately the same employing the present invention over other known techniques.

Referring to FIG. 7, a semiconductor structure 105 is shown prior to undergoing a first step of a preferred embodiment of the present invention. As shown, structure 105 comprises a semiconductor substrate 110 having various dopant regions necessary for fabricating a complementary bipolar junction transistor ("BJT") comprising both a PNP and an NPN transistor.

Given the intended complementary nature of structure 105, substrate 10 comprises a P⁻ well 115 and an N⁻ well 160, and an isolation region 140, realized by either trench or junction isolation techniques, within substrate between both well for isolation one from the other. Both wells, 115 and 160, have a diffusion depth substantially in the range of 2 μm to 3 μm. Further, both P⁻ well 115 and an N⁻ well 160 further comprise a P⁺ buried layer 120 and an N⁺ buried layer 165, respectively. Substrate 110 further comprises a P⁺ sink deep diffusion region 130 and a N⁺ sink deep diffusion region 150 each having a diffusion depth of approximately 3 μm.

Formed within P⁻ well 115 is an N⁻ base 135. N⁻ base 135 has a junction depth of approximately 0.3 μm. Further, N⁻ base 135 comprises a silicon bandgap of approximately 1.1 eV. N⁻ base 135 is formed by first implanting a base type dopant and subsequently performing an annealing step. Similarly, formed within N⁻ well 160 is an P⁻ base 155. P⁻ base 155 has a junction depth of approximately 0.3 μm and comprises a silicon bandgap of approximately 1.1 eV. Likewise, P⁻ base 155 is formed by first implanting a base type dopant and subsequently performing an annealing step.

Referring to FIG. 8, semiconductor structure 105 is shown after undergoing the first step of the preferred embodiment. Here, an interlevel dielectric layer 170 is formed superjacent the upper surface of the substrate 100. Interlevel dielectric layer 170 preferably comprises silicon dioxide, though other dielectric materials may be employed, and has a thickness of approximately 1000Å. Further, layer 170 may be formed by various means known in the art, including a thermal growth or deposition step, as well as through rapid thermal processing techniques.

Referring to FIG. 9, semiconductor structure 5 is shown after undergoing the second step of the preferred embodiment. Upon forming interlevel dielectric layer 170, the layer is patterned by removing selected portions such that a first and second segment of substrate 110, and more particularly, N⁻ base 135 and P⁻ base 155, are exposed. This gap is created to provide electrical access to a subsequently formed first and second emitter, described hereinbelow.

The step of patterning interlevel dielectric layer 170 may be realized by several known methods. One such method includes depositing a layer of photoresist (not shown) superjacent interlevel dielectric layer 170 according to a predetermined pattern. This pattern leaves the first and second segments of layer 170 to be removed uncovered by the photoresist. With the pattern of photoresist developed, those surface areas not covered by the photoresist are then etched. Thus, the areas covered by the photoresist remain intact, and the remaining photoresist layer is removed, thereby resulting in the structure of FIG. 9.

Subsequent to the step of patterning, layer 170 in conjunction with the first and second segments of substrate 110 exposed are atomically cleaned by means of an interfacial etch to remove native oxide (not shown). In an open loop system, upon completing this additional step, a native oxide layer having a known thickness approximately in the range of 4Å to 8Å will regrow superjacent both layer 170 and the first and second segments of substrate 110 exposed. However, in a further embodiment, a closed loop system is employed, virtually eliminating the regrowth of native oxide.

Referring to FIG. 10, semiconductor structure 105 is shown after undergoing the third step of the preferred embodiment. Once interlevel dielectric layer 170 is patterned and cleaned, a contact layer 175 is formed superjacent interlevel dielectric layer 170. Contact layer 175 preferably comprises amorphous silicon because its small grain size relative to polysilicon slows the subsequent diffusion of dopants into the $N^-$ base 135 and $P^-$ base 155 in forming both first and second emitters. However, alternatives to amorphous silicon may be also employed to achieve a similar purpose.

The slower diffusion rate realized by the present invention can better understood by comparing the diffusion enhancement factors of known polysilicon contact with the present invention. Diffusion enhancement factor is defined as the ratio of diffusion in the contact layer to substrate. In the known polysilicon design, this ratio is approximately 200. However, employing the present invention, using a contact layer have a small grain size relative to polysilicon, this ratio is in the range of approximately 300 to 400.

Contact layer 175 may be formed by any one of several techniques known to one of ordinary skill in the art such as plasma enhanced chemical vapor deposition ("PECVD"). However, a low pressure chemical vapor deposition ("LPCVD") step is preferred. When using an LPCVD, the step would be preferably performed at a temperature substantially in the range of 450° C. and 600° C. and at a pressure substantially in the range of 100 mT and 200 mT.

Referring to FIG. 11, semiconductor structure 105 is shown after undergoing the third step of the preferred embodiment. Here, a first photoresist mask 180 is initially deposited over the portion of the contact layer 175 associated the $P^-$ well 115 and its $N^-$ base 135. Subsequently, a first portion contact layer 175 is implanted with a dose of a first dopant. As a result of this step, one of two emitters, 195, of the complementary BJT may be ultimately formed within $P^-$ base 155. Once the first portion contact layer 175 is implanted, first mask 180 is removed.

The step of implanting is preferably performed at a electron voltage substantially in the range of 20 KeV and 60 KeV. Further, the preferable dose of the dopant implanted into contact layer 45 is substantially in the range of $2 \times 10^{15}$ to $2 \times 10^{16}$ $cm^{-2}$. The dopant selected for implanting into the first portion of the contact layer 175 is preferably comprises boron.

Referring to FIG. 12, semiconductor structure 105 is shown after undergoing the fourth step of the preferred embodiment. Here, first a second photoresist mask 185 is deposited over the portion of the contact layer 175 associated the $N^-$ well 160 and its $P^-$ base 155. Subsequently, a second portion contact layer 175 is implanted with a dose of a second dopant. As a result of this step, one of two emitters, 190, of the complementary BJT may be ultimately formed within $N^-$ base 135. Once the first portion contact layer 175 is implanted, second mask 185 is removed.

The step of implanting is preferably performed at a electron voltage substantially in the range of 20 KeV and 60 KeV. Further, the preferable dose of the dopant implanted into contact layer 175 is substantially in the range of $2 \times 10^{15}$ to $2 \times 10^{16}$ $cm^{-2}$. The second dopant preferably comprises phosphorus, while arsenic may also be employed.

Referring to FIG. 13, semiconductor structure 105 is illustrated upon undergoing the fifth step of the preferred embodiment of the present invention. As contact layer 175 has now been implanted with both first and second dopants for the purpose of fabricating both first and the second emitters, a first and a second electrical contact, 175a and 175b, may be formed by removing the excess portions of contact layer 175.

The step of removing portions of the contact layer 175 to form first and second electrical contacts, 175a and 175b, may be realized by various methods. One such method includes depositing a layer of photoresist (not shown) superjacent contact layer 175 according to a predetermined pattern. With the pattern of photoresist developed, the areas not covered by the photoresist are then etched resulting in first and second electrical contacts, 175a and 175b.

With both electrical contacts formed, a final anneal step is required to diffuse both first and second implanted dopants from their respective contacts into $N^-$ base 135 and $P^-$ base 155, respectively. As a result of enabling the implanted dopants to diffuse into $N^-$ base 135 and $P^-$ base 155, emitters 190 and 195 are formed for the complementary BJT.

This step of annealing may be realized by various methods known in the art. In one embodiment, the semiconductor structure is heated in a furnace at a temperature substantially in the range of 900° C. to 1000° C. for a time substantially in the range of 5 minutes to 2 hours. In a further embodiment, the semiconductor structure is heated in a rapid thermal processing chamber at a temperature substantially in the range of 1000° C. to 1200° C. for a time substantially in the range of 10 seconds to 1 minute.

While the steps described herein detail the formation of an emitter contact, collector and base contacts are also required to fabricate an operational bipolar junction transistor. These additional steps may be realized by various methods, including patterning the interlevel dielectric layer 170, as well as the contact layer 175, accordingly.

It has been observed that the larger grain size of contacts 175a and 175b relative to substrate 10, slows the diffusion of each dopant—boron and either phosphorus or arsenic—during the anneal step into $N^-$ base 135 and $P^-$ base 155 in forming emitters 190 and 195. As a result of this slower diffusion rate, emitters 190 and 195 comprise a shallower junction within their respective base regions.

By devising this method, the resultant PNP type BJT was observed to have a substantially improved Early voltage over known polysilicon emitter designs, while maintaining or improving the device's current gain by reducing the base current. This rise in the Early voltage can be attributed to a reduction in the pinched base sheet resistance.

In one experiment, Early voltages of approximately 80V and 460V, and current gains ($\beta$) of 53 and 70 were respectively measured for a PNP and an NPN device of a complementary BJT using the present invention. This resulted in current gain Early voltage products of 4240 and 32,200 for the PNP and NPN devices, respectively. In contrast, Early voltages of 48V and 460V, and current gains ($\beta$) of 53 and 110 for PNP and NPN devices, respectively, of a complementary polysilicon emitter type BJT not employing the present invention. This resulted in current gain Early voltage products of 2544 and 50,600 for the PNP and NPN devices, respectively. Thus, a conclusion can be arrived at that the present invention increases the Early voltage, while essentially maintaining the device's current gain ($\beta$).

Moreover, It should be noted that the increase in value of the Early voltage may be somewhat dependent on the biasing voltage employed. In the above referred to experiment, the BJTs employed for comparative purposes utilized a 35V biasing voltage. The value of the Early voltage would be accordingly reduced for smaller biasing voltages, though the increase would be proportionately the same employing the present invention over other known techniques.

In view of the above, it should be obvious to one of ordinary skill in the art, however, that the present invention primarily benefits vertical PNP type BJT devices. Further, while the current gain is diminished in the NPN device of the complementary BJT, means are available to raise this characteristic utilizing design tradeoffs.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method of fabricating a complementary bipolar junction transistor ("BJT") having an increased Early voltage from a semiconductor substrate, said substrate comprising a first well, a second well, and an isolation region for isolating said first well from said second well, said first well having a first conductivity and comprising a first base region and a first collector region, said second well having a second conductivity and comprising a second base region and a second collector region, said method comprising the steps of:

forming an interlevel dielectric layer superjacent said substrate;

removing portions of said interlevel dielectric layer such that a first segment of said substrate is exposed for accessing said first base region and a second segment of said substrate is exposed for accessing said second base region;

forming a contact layer superjacent said interlevel dielectric layer, said contact layer comprising a material having a grain size smaller than polycrystalline silicon;

masking said first base region with a first mask;

implanting said contact layer with a first dopant;

removing said first mask;

masking said second base region with a second mask;

implanting said contact layer with a second dopant;

removing said second mask;

removing portions of said contact layer to form a first and a second electrical contact for the complementary BJT; and annealing said substrate such that said first dopant diffuses into said first base region to form a first emitter region and said second dopant diffuses into said second base region to form a second emitter region, thereby increasing Early voltage of the bipolar junction transistor.

2. The method of claim 1, wherein said interlevel dielectric layer comprises silicon dioxide.

3. The method of claim 1, wherein said interlevel dielectric layer comprises a thickness of approximately 1000Å.

4. The method of claim 1, further comprising the step of:

cleaning a surface of said interlevel dielectric layer and said first and said second segments of said substrate exposed.

5. The method of claim 1, wherein said step of removing portions of said interlevel dielectric layer comprises the steps of:

forming a patterned photoresist mask superjacent said interlevel dielectric layer such that a portion of said interlevel dielectric layer remains exposed;

etching said portion of said interlevel dielectric layer exposed; and removing said patterned photoresist mask.

6. The method of claim 1, wherein said contact layer comprises amorphous silicon.

7. The method of claim 1, wherein said step of forming a contact layer comprises the step of:

forming said contact layer superjacent said patterned interlevel dielectric layer by means of a low pressure chemical vapor deposition step.

8. The method of claim 7, wherein said low pressure chemical vapor deposition step is performed at a temperature substantially in the range of 450° C. and 600° C. at a pressure substantially in the range 100 mT and 200 mT.

9. The method of claim 1, wherein said step of removing portions of said contact layer comprises the steps of:

forming a patterned photoresist mask superjacent said contact layer such that a portion of said contact layer remains exposed;

etching said exposed portion of said contact layer to form said first and said second electrical contacts; and removing said patterned photoresist mask.

10. The method of claim 1, wherein said first dopant comprises boron, said second dopant comprises arsenic or phosphorus.

11. The method of claim 1, wherein said implanting steps are performed at a electron voltage of substantially in the range of 20 KeV and 60 KeV, and at least one of said first and second dopants comprises a dose substantially in the range of $2\times10^{15}$ to $2\times10^{16}$ cm$^{-2}$.

12. The method of claim 1, wherein said annealing step comprises the step of:

heating said substrate in a furnace at a temperature substantially in the range of 850° C. to 1000° C. for a time substantially in the range of 5 minutes to 2 hours, or heating said substrate in a rapid thermal processing chamber at a temperature substantially in the range of 1000° C. to 1200° C. for a time substantially in the range of 10 seconds to 1 minute.

* * * * *